United States Patent
Kelly et al.

(10) Patent No.: US 7,187,177 B2
(45) Date of Patent: Mar. 6, 2007

(54) METHOD OF MONITORING A POWER DISTRIBUTION UNIT

(75) Inventors: John H. Kelly, Phoenix, AZ (US); Naufel C. Naufel, Tempe, AZ (US)

(73) Assignee: Motorola, Inc., Schaumburg, IL (US)

( * ) Notice: Subject to any disclaimer, the term of this patent is extended or adjusted under 35 U.S.C. 154(b) by 224 days.

(21) Appl. No.: 11/093,855

(22) Filed: Mar. 30, 2005

(65) Prior Publication Data

US 2006/0221524 A1    Oct. 5, 2006

(51) Int. Cl.
*G01R 31/02* (2006.01)
*H02B 1/01* (2006.01)

(52) U.S. Cl. ..................... 324/424; 361/627

(58) Field of Classification Search ........... 324/424, 324/66; 361/627
See application file for complete search history.

(56) References Cited

U.S. PATENT DOCUMENTS 5,233,330 A * 8/1993 Hase ..................... 340/638
6,005,757 A * 12/1999 Shvach et al. ............. 361/64
6,154,032 A * 11/2000 Coia et al. ................ 324/424
6,490,153 B1 * 12/2002 Casebolt et al. ........... 361/685
2004/0141274 A1 * 7/2004 Novinsky et al. ......... 361/93.1

OTHER PUBLICATIONS

"RADSOK High Amperage Electrical Terminals", Technical Brief, Revised May 2001, KonneKtech, Fraser, MI 48026, pp. 1-23.

* cited by examiner

*Primary Examiner*—Anjan Deb
(74) *Attorney, Agent, or Firm*—Kevin D. Wills (57) ABSTRACT

A method of monitoring a power distribution unit (306) may include providing a power distribution unit frame (310), where the power distribution unit frame has a 2U form factor (312), and where the power distribution unit frame is coupled to mount in an embedded computer frame (102). An alarm module (418) may be coupled to a circuit breaker connection site (214) in the power distribution unit frame. The alarm module may detect whether a circuit breaker (416) is coupled to the circuit breaker connection site via a set of auxiliary contacts (439). If the alarm module detects the circuit breaker, the alarm module monitors a set of shelf conditions. If the alarm module fails to detect the circuit breaker, the alarm module does not monitor the set of shelf conditions.

20 Claims, 5 Drawing Sheets

METHOD OF MONITORING A POWER DISTRIBUTION UNIT

RELATED APPLICATIONS

Related subject matter is disclosed in U.S. patent application entitled "HIGH DENSITY POWER DISTRIBUTION UNIT" having application Ser. No. 11/093,628 and filed on the same date herewith and assigned to the same assignee.

BACKGROUND OF INVENTION

Prior art power distribution units for rack-mounted embedded computer systems are limited, due to spatial constraints, in the power they can supply to individual computing blades. For example, the number of circuit breakers and power connections to a prior art power distribution unit is limited by the projected area of the front or rear portions. Further, the limited space in the rear of the power distribution unit prevents the use of larger connectors required of higher-powered inputs and outputs.

Prior art power distribution units are also limited in their ability to hot-swap circuit breakers without necessitating system reconfiguration or shutdown. Further, prior art power distribution units are limited in their ability to report specific types of power feed failures.

There is a need, not met in the prior art, for a dynamically configurable, high power density power distribution unit. Accordingly, there is a significant need for an apparatus and method that overcomes the deficiencies of the prior art outlined above.

BRIEF DESCRIPTION OF THE DRAWINGS

Representative elements, operational features, applications and/or advantages of the present invention reside inter alia in the details of construction and operation as more fully hereafter depicted, described and claimed—reference being made to the accompanying drawings forming a part hereof, wherein like numerals refer to like parts throughout. Other elements, operational features, applications and/or advantages will become apparent in light of certain exemplary embodiments recited in the Detailed Description, wherein:

Elements in the Figures are illustrated for simplicity and clarity and have not necessarily been drawn to scale. For example, the dimensions of some of the elements in the Figures may be exaggerated relative to other elements to help improve understanding of various embodiments of the present invention. Furthermore, the terms "first", "second", and the like herein, if any, are used inter alia for distinguishing between similar elements and not necessarily for describing a sequential or chronological order. Moreover, the terms "front", "back", "top", "bottom", "over", "under", and the like in the Description and/or in the Claims, if any, are generally employed for descriptive purposes and not necessarily for comprehensively describing exclusive relative position. Any of the preceding terms so used may be interchanged under appropriate circumstances such that various embodiments of the invention described herein may be capable of operation in other configurations and/or orientations than those explicitly illustrated or otherwise described.

DETAILED DESCRIPTION OF EXEMPLARY EMBODIMENTS

The following representative descriptions of the present invention generally relate to exemplary embodiments and the inventor's conception of the best mode, and are not intended to limit the applicability or configuration of the invention in any way. Rather, the following description is intended to provide convenient illustrations for implementing various embodiments of the invention. As will become apparent, changes may be made in the function and/or arrangement of any of the elements described in the disclosed exemplary embodiments without departing from the spirit and scope of the invention.

A detailed description of an exemplary application, namely a dynamically configurable, high power density power distribution unit, is provided as a specific enabling disclosure that may be generalized to any application of the disclosed system, in accordance with various embodiments of the present invention.

Figure 1:
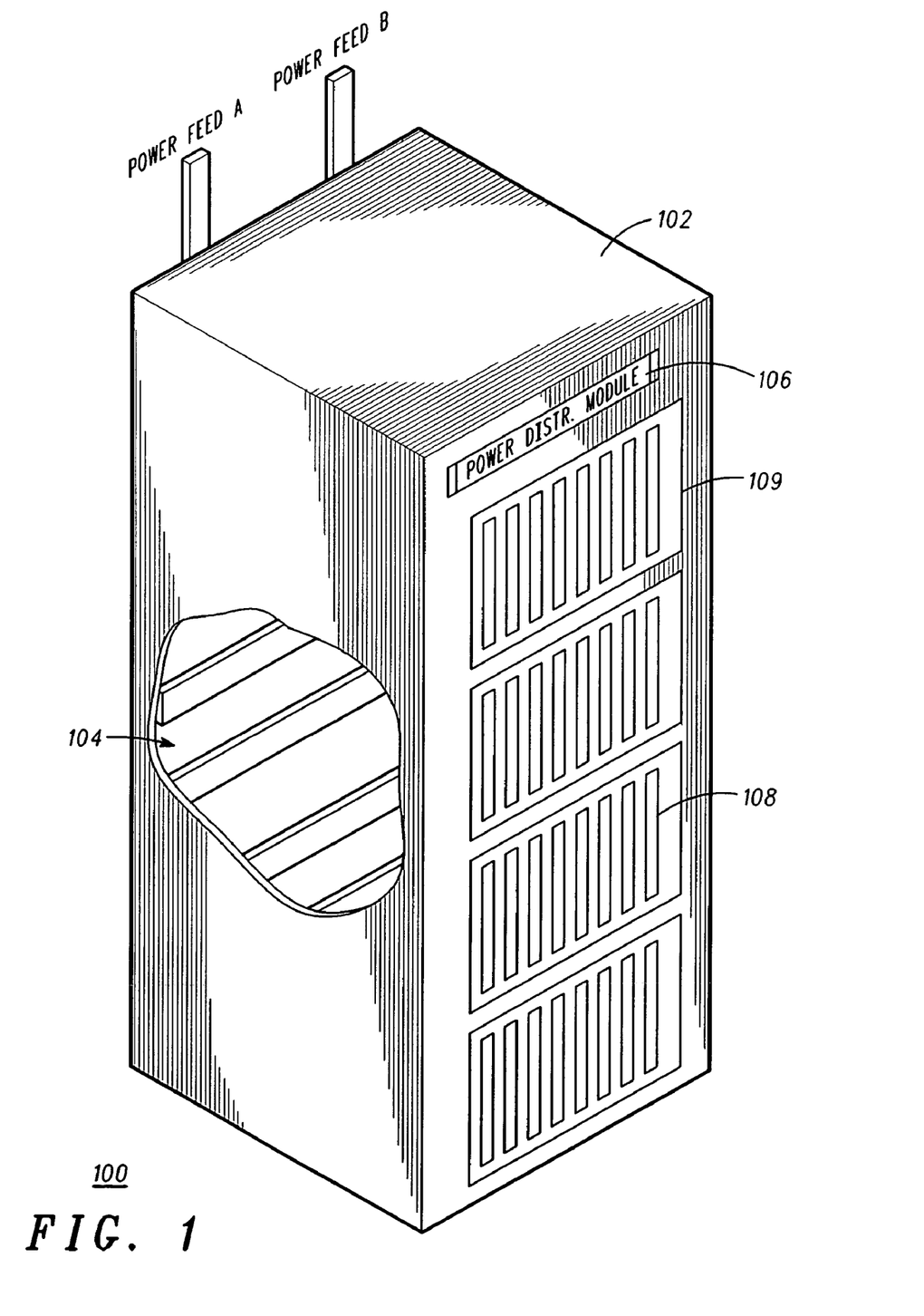
FIG. 1 representatively illustrates embedded computer system in accordance with an exemplary embodiment of the present invention.

FIG. 1 representatively illustrates embedded computer system 100 in accordance with an exemplary embodiment of the present invention. As shown in FIG. 1, embedded computer system 100 may include an embedded computer frame 102, backplane 104, shelf 109 with software and a plurality of slots for inserting computing blade 108, power distribution unit 106, and the like. Backplane 104 may be used for coupling blades placed in plurality of slots and power distribution.

In an embodiment, a computing blade 108 may comprise a switch blade, payload blade, and the like, coupled to any number of other computing blades via backplane 104. Backplane 104 may accommodate any combination of a packet switched backplane including a distributed switched fabric or a multi-drop bus type backplane. Backplanes may support AdvancedTCA™, CompactPCI®, CompactTCA™, and the like. Computing blade 108 may add functionality to embedded computer system 100 through the addition of processors, memory, storage devices, I/O elements, and the like. In other words, a computing blade 108 may include any combination of processors, memory, storage devices, I/O elements, and the like, to give embedded computer system 100 any functionality desired by a user. In the embodiment shown, there are sixteen slots to accommodate any combination of power distribution units 106 and computing blades 108. However, an embedded computer frame 102 with any number of shelves 109 or slots may be included in the scope of the invention.

In an embodiment, embedded computer system 100 can use a switch blade as a central switching hub with any number of payload blades coupled to the switch blade. Embedded computer system 100 may support a point-topoint, switched input/output (I/O) fabric. Embedded computer system 100 may include both node-to-node (for example computer systems that support I/O node add-in slots) and chassis-to-chassis environments (for example interconnecting computers, external storage systems, external Local Area Network (LAN) and Wide Area Network (WAN) access devices in a data-center environment). Embedded computer system 100 may be implemented by using one or more of a plurality of switched fabric network standards, for example and without limitation, InfiniBand™, Serial RapidIO™, Ethernet™, AdvancedTCA™, CompactPCI®, CompactTCA™, PCI Express™, and the like. Embedded computer system 100 is not limited to the use of these switched fabric network standards and the use of any switched fabric network standard is within the scope of the invention.

In one embodiment, backplane 104 can be an embedded packet switched backplane as is known in the art. In another embodiment, backplane 104 can be an overlay packet switched backplane that is overlaid on top of a backplane that does not have packet switched capability. In any embodiment of the invention, computing blades 108 may communicate with each other via a plurality of links, for example and without limitation, 100-ohm differential signaling pairs.

In an embodiment, embedded computer frame 102, shelf 109 and backplane 104 can use the CompactPCI® (CPCI) Serial Mesh Backplane (CSMB) standard as set forth in PCI Industrial Computer Manufacturers Group (PICMG®) specification 2.20, promulgated by PICMG®, 301 Edgewater Place, Suite 220, Wakefield, Mass. CSMB provides infrastructure for applications such as Ethernet, Serial RapidIO, other proprietary or consortium based transport protocols, and the like. In another embodiment embedded computer frame 102 can use an Advanced Telecom and Computing Architecture (ATCA™) standard as set forth by PICMG®. The embodiment of the invention is not limited to the use of these standards, and the use of other standards is within the scope of the invention.

In an embodiment, embedded computer frame 102 and/or shelf 109 may provide redundancy in the slot configuration by providing that each slot has a corresponding slot such that computing blade 108 has a corresponding computing blade in a corresponding slot. For example, if computing blade 108 were to cease to function, a corresponding computing blade may assume the functions of computing blade 108 without interruption of service. This redundancy may hold for both switch blades and payload blades and provides embedded computer frame 102 with greater reliability.

In an embodiment, embedded computer frame 102 may be fed power by two or more redundant power supplies, for example power feed A and power feed B. The redundant power supplies may be passed through power distribution unit 106 to distribute power to shelves 109 and computing blades 108.

Figure 2:
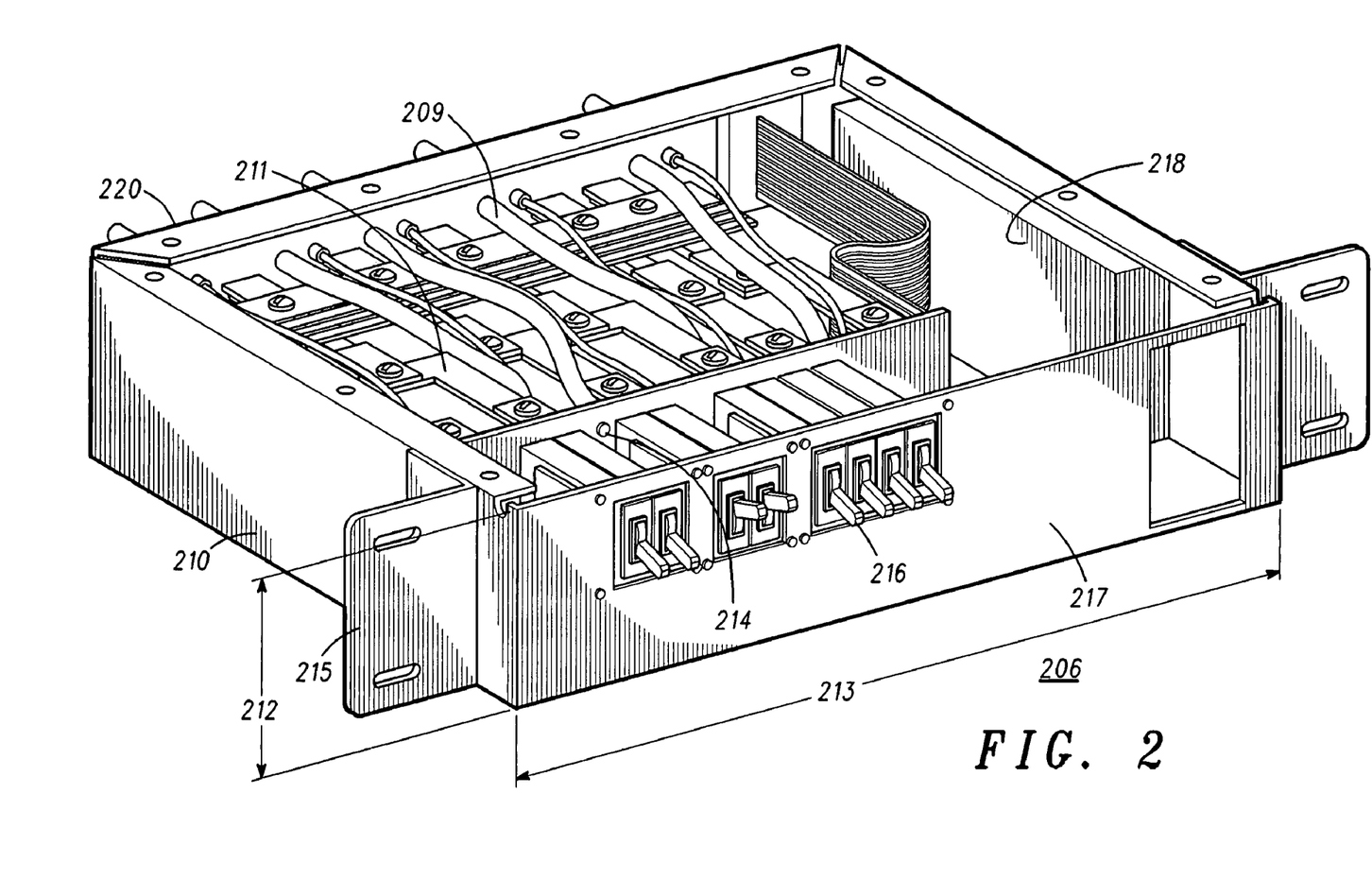
FIG. 2 representatively illustrates a power distribution unit in accordance with an exemplary embodiment of the present invention.

FIG. 2 representatively illustrates a power distribution unit 206 in accordance with an exemplary embodiment of the present invention. In an embodiment, power distribution unit 206 may provide power to embedded computer frame 102 and computing blades 108 as shown and described in FIG. 1. Power distribution unit 206 may be modular within embedded computer frame 102 and coupled to receive power from an outside source and distribute it to any number of computing blades 108 in embedded computer frame 102.

As shown in FIG. 2, power distribution unit (PDU) 206 may include power distribution unit frame 210 coupled to include a front portion 217 and a rear portion 220. Front portion 217 may be coupled to include any number of circuit breakers 216, each coupled to a circuit breaker connection site 214.

Power distribution unit frame 210 may also include power ingress and egress sites located on rear portion 220. In an embodiment, circuit breaker connection site 214 is interposed between a power ingress site and a power egress site.

Power coming into power distribution unit 206 may be distributed to circuit breaker connection sites 214 by any number of bus bars 211. After passing through a circuit breaker 216, power may exit the power distribution unit 206 to be distributed to any number of computing blades through power cabling 209.

In an embodiment, power distribution unit 206 may include alarm module 218, which may function to monitor power distribution unit 206 and the status of power being distributed by power distribution unit 206. In an embodiment, alarm module 218 may also monitor the status of computing blades being supplied by power distribution unit 206. In another embodiment, alarm module 218 may function to alert, locally and/or remotely, a system administrator of any of a set of alert conditions monitored. Alarm module 218 may be any combination of hardware, software, and the like, including software running on hardware. Although alarm module 218 is shown as being contained in power distribution unit frame 210, alarm module may be distributed among any number of entities, including power distribution unit 206 and be within the scope of the invention.

In an embodiment, power distribution unit frame 210 may have a frontal elevation dimension that may be characterized as a form factor 212. In an embodiment, the form factor 212 may include, substantially, the frontal elevation dimension. Embedded computer frame 102 may be designed to accommodate a power distribution unit frame 210 having a given form factor 212. In an exemplary embodiment, power distribution unit frame 210 may have a 2U form factor. As is known in the art, "U" and multiples of "U" can refer to the height of a module or blade. In an embodiment, "U" can measure approximately 1.75 inches. Although power distribution unit frame 210 is shown in a horizontal configuration, this is not limiting of the invention. Power distribution unit frame 210 may be in a vertical configuration, with form factor 212 being the width of power distribution unit frame 210, and be within the scope of the invention.

In an embodiment, power distribution unit frame 210 may have a frontal length 213. The frontal length may be chosen by a systems designer, and may correspond to one of several industry standard frontal lengths. For example, a frontal length 213 of substantially 19", 23" and 600 mm are well known. Other frontal lengths are within the scope of the invention. In an embodiment, the frontal length 213 may be smaller than that accepted by an embedded computer frame 102. In this embodiment, power distribution unit frame 210 may include an adaptor module 215 on one or both ends. Adaptor module 215 may function to allow a power distribution unit frame 210 with a smaller frontal length to interface with an embedded computer frame 102 designed to accept a power distribution unit frame with a larger frontal length. Although power distribution unit frame 210 is shown in a horizontal configuration, this is not limiting of the invention. Power distribution unit frame 210 may be in a vertical configuration, with frontal length 213 being the height of power distribution unit frame 210, and be within the scope of the invention.

Figure 3:
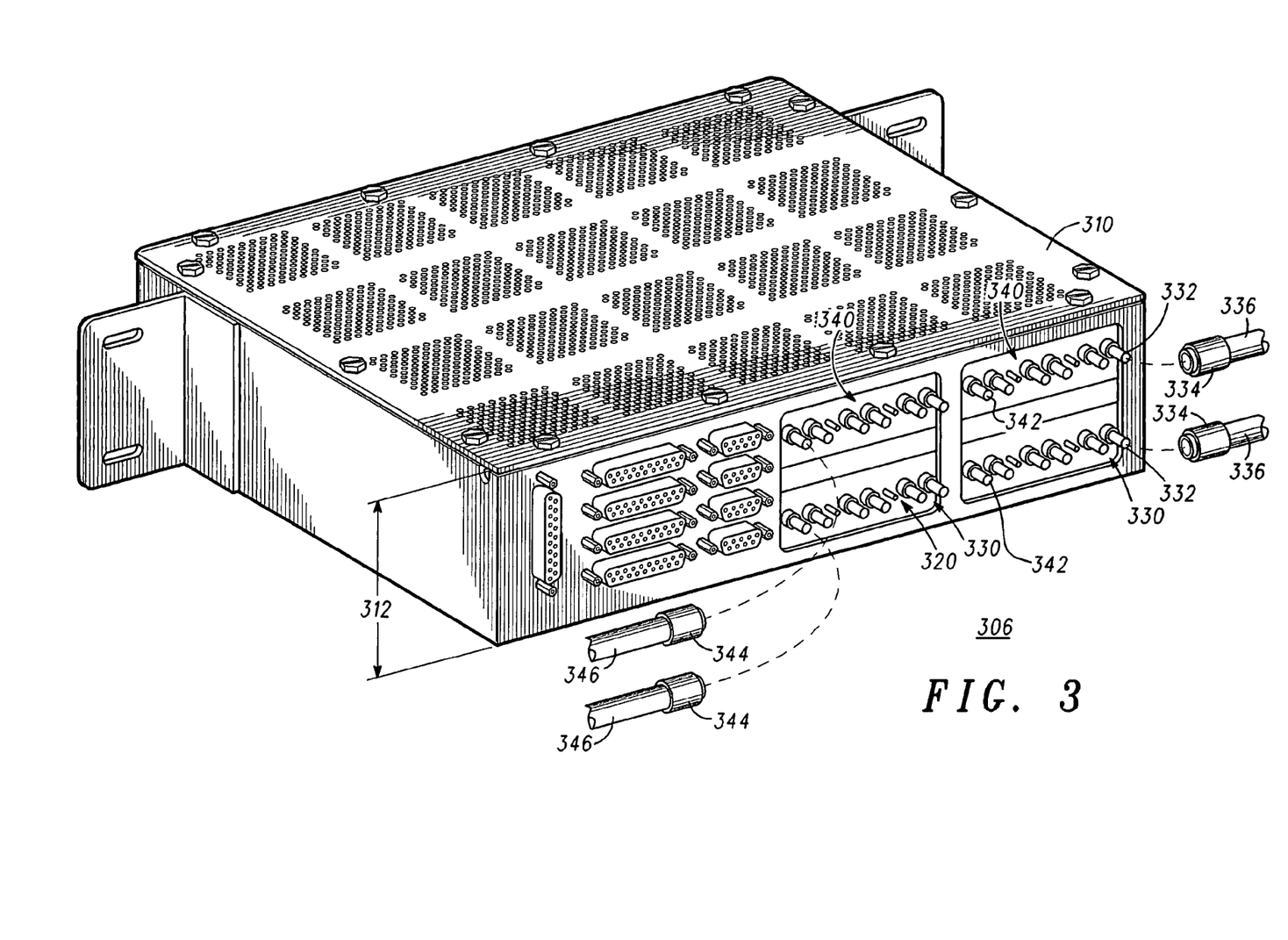
FIG. 3 representatively illustrates a power distribution unit in accordance with an exemplary embodiment of the present invention.

FIG. 3 representatively illustrates a power distribution unit 306 in accordance with an exemplary embodiment of the present invention. In the embodiment shown in FIG. 3, power distribution unit 306 has a 2U form factor 312.

Rear portion 320 of power distribution unit frame 310 may include a plurality of power ingress sites 330 where power may enter power distribution unit 306. Each of plurality of power ingress sites 330 may include an ingress pin 332 coupled to interface with an ingress, in-line hyperboloid radial socket 334. In an exemplary embodiment, each power ingress site 330 may include two ingress pins 332, a power input pin and a return pin. Each ingress pin 332 is coupled to interface with an ingress, in-line hyperboloid radial socket 334.

In an embodiment, ingress, in-line hyperboloid radial socket 334 may be comprised of multiple contacting elements that are hyperbolically arrayed around the inner diameter of the socket. Each of the contact elements may be skewed with respect to the axial direction of the socket. When the ingress pin 332 is coupled with the socket, the contacting elements mechanically wrap around the ingress pin providing a normal force for a positive mechanical and electrical connection. Coupling ingress, in-line hyperboloid radial socket 334 to ingress pin 332 does not require mechanical fasteners. An example of an embodiment of an ingress, in-line hyperboloid radial socket 334 is the RAD-SOK® connector as described in the "RADSOK® High Amperage Electrical Terminals, Technical Brief" May 2001.

Ingress, in-line hyperboloid radial socket 334 may be coupled to ingress power conductor 336, wherein ingress power conductor 336 is coupled to bring power to power distribution unit 306. Radial socket 334 has an in-line configuration such that the axial direction of both the radial socket 334 and the ingress power conductor 336 are in substantially the same direction. This is as opposed to a non-in-line radial socket where the axial direction of the radial socket 334 and an ingress power conductor 336 are offset substantially ninety degrees with respect to each other.

The in-line configuration of radial socket 334 allows more power ingress sites 330 in the limited space defined by a projection of the rear portion 320 of power distribution unit 306. This also allows for a greater current capacity density of the power distribution unit 306 and plurality of power ingress sites 330, which may be defined as the amount of current input through the rear portion 320 of a power distribution unit 306.

In an embodiment, each of power ingress sites 330 may have a current capacity of at least one hundred amperes. That is to say, each power ingress site 330 is capable of conducting at least one hundred amperes into power distribution unit 306. In an embodiment, power distribution unit 306 may have at least six power ingress sites 330, giving the power distribution unit 306 and plurality of power ingress sites 330 a current capacity density of at least six hundred amperes.

Rear portion 320 of power distribution unit frame 310 may include a plurality of power egress sites 340 where power may exit power distribution unit 306. Each of plurality of power egress sites 340 may include an egress pin 342 coupled to interface with an egress, in-line hyperboloid radial socket 344. In an exemplary embodiment, each power egress site 340 may include two egress pins 342, a power output pin and a return pin. Each egress pin 342 is coupled to interface with an egress, in-line hyperboloid radial socket 344.

In an embodiment, egress, in-line hyperboloid radial socket 344 may be comprised of multiple contacting elements that are hyperbolically arrayed around the inner diameter of the socket. Each of the contact elements may be skewed with respect to the axial direction of the socket.

When the egress pin 342 is coupled with the socket, the contacting elements mechanically wrap around the egress pin providing a normal force for a positive mechanical and electrical connection. Coupling egress, in-line hyperboloid radial socket 344 to egress pin 342 does not require mechanical fasteners. An example of an embodiment of an egress, in-line hyperboloid radial socket 344 is the RAD-SOK® connector as described in the "RADSOK® High Amperage Electrical Terminals, Technical Brief" May 2001.

Egress, in-line hyperboloid radial socket 344 may be coupled to egress power conductor 346, wherein egress power conductor 346 is coupled to distribute power from power distribution unit 306 to any number of computing blades. Radial socket 344 has an in-line configuration such that the axial direction of both the radial socket 344 and the egress power conductor 346 are in substantially the same direction. This is as opposed to a non-in-line radial socket where the axial direction of the radial socket 344 and an egress power conductor 346 are offset substantially ninety degrees with respect to each other.

The in-line configuration of radial socket 344 allows more power egress sites 340 in the limited space defined by a projection of the rear portion 320 of power distribution unit 306. This also allows for a greater current capacity density of the power distribution unit 306 and plurality of power egress sites 340, which may be defined as the amount of current output through the rear portion 320 of a power distribution unit 306.

In an embodiment, at least a portion of the plurality of power egress sites 340 may have a current capacity of at least one hundred amperes. That is to say, at least a portion of the plurality of power egress site 340 is capable of conducting at least one hundred amperes out of power distribution unit 306. In an embodiment, power distribution unit 306 may have at least ten power egress sites 340. In an embodiment, a power egress site 340 may supply power to a computing blade requiring at least two hundred Watts.

Figure 4:
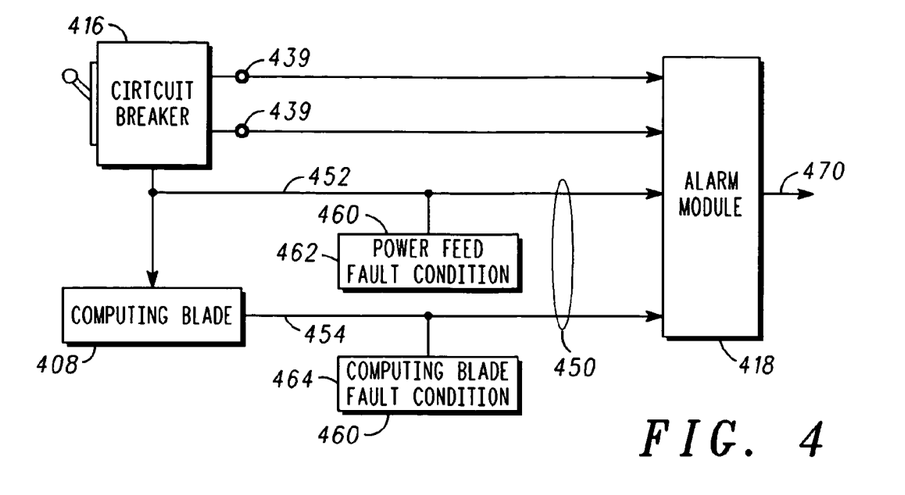
FIG. 4 representatively illustrates a block diagram of a power distribution system in accordance with an exemplary embodiment of the present invention.

FIG. 4 representatively illustrates a block diagram of a power distribution system in accordance with an exemplary embodiment of the present invention. Power distribution system may include a circuit breaker 416 and an alarm module 418 in a power distribution unit in accordance with the above embodiments. Computing blade 408 may be coupled to an embedded computer shelf and coupled to receive power through circuit breaker 416.

In an embodiment, alarm module 418 may function to monitor power distribution unit and the status of power being distributed by power distribution unit. In an embodiment, alarm module 418 may also monitor the status of computing blade 418 being supplied by power distribution unit. In another embodiment, alarm module 418 may function to alert, locally and/or remotely, a system administrator of any of a set of alert conditions monitored. Alarm module 418 may be any combination of hardware, software, and the like, including software running on hardware. Alarm module 418 may be contained in power distribution unit frame or distributed among any number of entities, including power distribution unit.

In an embodiment, circuit breaker 416 comprises a set of auxiliary contacts 439 that may be coupled to alarm module 418. In an embodiment, alarm module 418 may monitor the status of set of auxiliary contacts 439 to determine if circuit breaker 416 is coupled to circuit breaker connection site. Set of auxiliary contacts 439 may comprise two or more contacts coupled to indicate the status of circuit breaker 416. Al,arm module 418 may also monitor the status of the set of auxiliary contacts 439 if circuit breaker 416 is present.

In an exemplary embodiment, circuit breaker may have two auxiliary contacts 439 coupled to alarm module 418. When circuit breaker 416 is coupled to circuit breaker connection site, one auxiliary contact may be normally open while the other auxiliary contact may be normally closed. If alarm module 418 detects this condition, it may indicate that circuit breaker 416 is installed in power distribution unit and coupled to circuit breaker connection site. It also may indicate that circuit breaker is closed and operating normally.

In another embodiment, when no circuit breaker is coupled to circuit breaker connection site, set of auxiliary contacts may both read open, indicating that no circuit breaker is installed in power distribution unit at that circuit breaker connection site.

In yet another embodiment, if circuit breaker 416 is coupled to circuit breaker connection site, but circuit breaker 416 is tripped, then the normally open auxiliary contact may read closed, while the normally closed auxiliary contact may read open. This may indicate to alarm module 418 that circuit breaker 416 has tripped.

As described above, alarm module 418 may detect whether circuit breaker connection site has a circuit breaker 416 installed, and if installed, whether the circuit breaker 416 is operating normally or has tripped. In an embodiment, if alarm module 418 detects that circuit breaker 416 is coupled to circuit breaker connection site via set of auxiliary contacts 439, alarm module 418 may monitor a set of shelf conditions 450. If alarm module 418 fails to detect circuit breaker 416 coupled to circuit breaker connection site, alarm module may not monitor set of shelf conditions 450.

In an embodiment, set of shelf conditions 450 may include, among other things, at least one of a computing blade condition 454 or a power feed condition 452. If alarm module 418 detects an alarm condition 460 from the set of shelf conditions 450, alarm module 418 may generate an alarm notice 470. In an embodiment, alarm condition 460 may be generated when any of the power feed condition 452 or the computing blade condition 454 meet a certain threshold or deviate from a bounded criteria, and the like.

For example, alarm module 418 may monitor power feed condition 462 for a power feed fault condition 462. In an embodiment, power feed fault condition 462 may be that circuit breaker 416 has tripped, power feed to computing blade 408 is below a threshold (voltage, current, etc.), and the like. If power feed fault condition 462 is detected, alarm module 418 may generate alarm notice 470. Unlike the prior art when a plurality of circuit breakers are present in power distribution unit, alarm module 418 may delineate which of the plurality of circuit breakers generated the power feed fault condition 462 or which computing blade 408 is not receiving the proper power feed.

In an embodiment, if circuit breaker 416 is detected by alarm module 418, alarm module 418 may monitor computing blade condition 454 of computing blade 408 that is supplied power by circuit breaker 416. Computing blade condition 454 may include any parameters that may be monitored, for example and without limitation, temperature, noise, power usage, and the like. If one of these computing blade conditions 454 falls below a threshold or deviates outside of an error band, then alarm module 418 may detect computing blade fault condition 464 and generate an alarm notice 470.

In an embodiment, alarm notice 470 may be transmitted locally or remotely from power distribution unit and embedded computing chassis. For example, alarm notice 470 may actuate indicator lights locally to notify a system administrator of the location of the fault. As another example, alarm notice 470 may be sent to a central office to notify a system administrator of the fault condition, including details of the type and location of the fault condition.

The apparatus described above permits the hot-swapping of circuit breaker 416. Hot-swapping indicates that circuit breaker 416 may be removed and replaced without removing power or disrupting other computing modules or data systems, for example in an embedded computer frame or embedded computer chassis. For example, if circuit breaker 416 is removed while power is connected to power distribution unit, alarm module detects the absence of circuit breaker 416 via set of auxiliary contacts 439, and alarm module 418 merely discontinues monitoring set of shelf conditions 450. If circuit breaker 416 is installed while power is connected to power distribution unit, alarm module 418 is enabled to monitor set of shelf conditions 450. With the present system, circuit breaker 416 may be removed and replaced while power is connected to power distribution unit without having to disrupt power or data feed from/to other computing blades.

Figure 5:
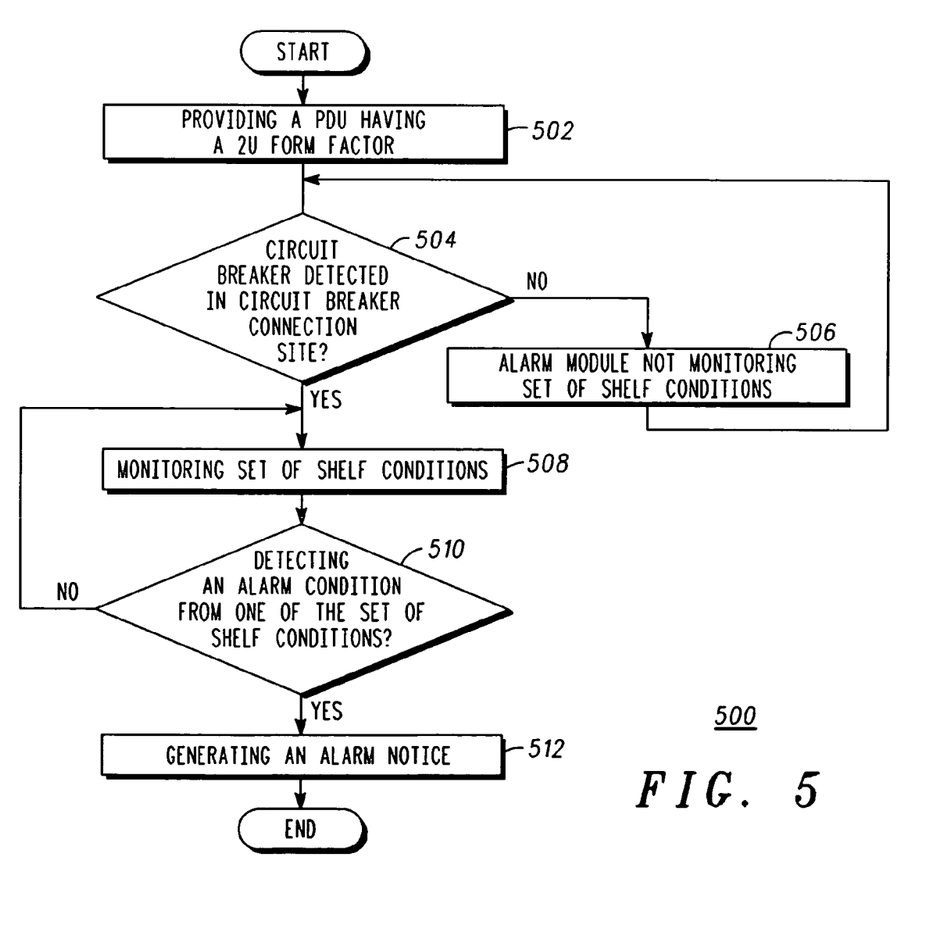
FIG. 5 representatively illustrates a flow diagram in accordance with an exemplary embodiment of the present invention.

FIG. 5 representatively illustrates a flow diagram 500 in accordance with an exemplary embodiment of the present invention. Step 502 provides a power distribution unit having a 2U form factor. In step 504, alarm module determines if a circuit breaker is coupled to circuit breaker connection site.

This can be done, for example, through a set of auxiliary contacts on the circuit breaker. If no circuit breaker is detected, alarm module does not monitor set of shelf conditions per set 506. If a circuit breaker is detected, alarm module monitors set of shelf conditions per step 508.

In step 510, it is determined if alarm module detects an alarm condition from the set of shelf conditions. If so, an alarm notice is generated per step 512.

Figure 6:
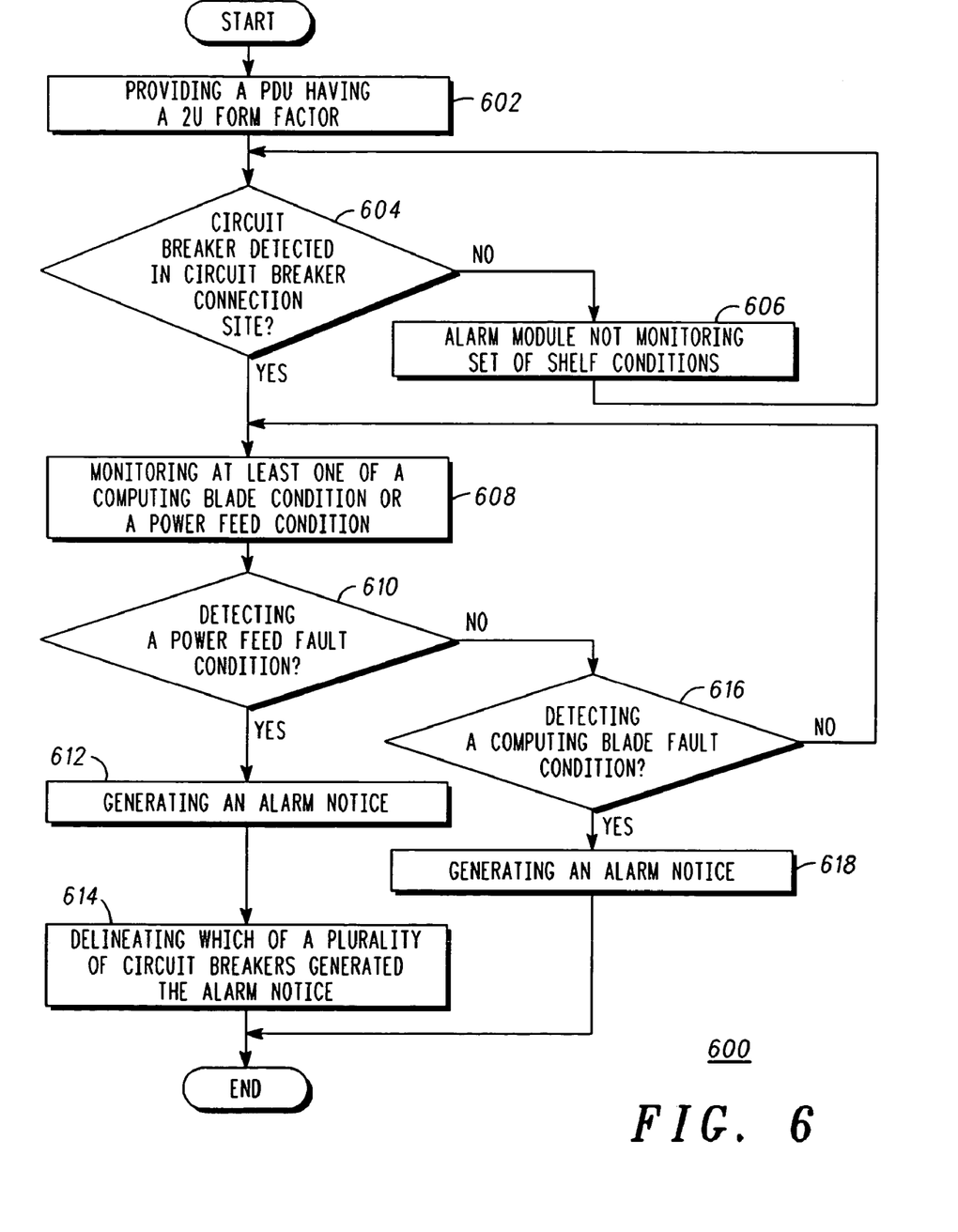
FIG. 6 representatively illustrates a flow diagram in accordance with an exemplary embodiment of the present invention.

FIG. 6 representatively illustrates a flow diagram 600 in accordance with an exemplary embodiment of the present invention. Step 602 provides a power distribution unit having a 2U form factor. In step 604, alarm module determines if a circuit breaker is coupled to circuit breaker connection site.

This can be done, for example, through a set of auxiliary contacts on the circuit breaker. If no circuit breaker is detected, alarm module does not monitor set of shelf conditions per set 606. If a circuit breaker is detected, alarm module monitors at least one of a computing blade condition or a power feed condition per step 608.

In step 610, it is determined if alarm module detects a power feed fault condition. If so, an alarm notice is generated per step 612, and alarm module includes in the alarm notice, a delineation of which circuit breaker out of a plurality of circuit breakers generated the alarm notice.

If no power feed fault condition is detected in step 610, step 616 determines if alarm module detects a computing blade fault condition. If so, alarm module may generate an alarm notice per step 618.

In the foregoing specification, the invention has been described with reference to specific exemplary embodiments; however, it will be appreciated that various modifications and changes may be made without departing from the scope of the present invention as set forth in the claims below. The specification and figures are to be regarded in an illustrative manner, rather than a restrictive one and all such modifications are intended to be included within the scope of the present invention. Accordingly, the scope of the invention should be determined by the claims appended hereto and their legal equivalents rather than by merely the examples described above.

For example, the steps recited in any method or process claims may be executed in any order and are not limited to the specific order presented in the claims. Additionally, the components and/or elements recited in any apparatus claims may be assembled or otherwise operationally configured in a variety of permutations to produce substantially the same result as the present invention and are accordingly not limited to the specific configuration recited in the claims.

Benefits, other advantages and solutions to problems have been described above with regard to particular embodiments; however, any benefit, advantage, solution to problem or any element that may cause any particular benefit, advantage or solution to occur or to become more pronounced are not to be construed as critical, required or essential features or components of any or all the claims.

As used herein, the terms "comprise", "comprises", "comprising", "having", "including", "includes" or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present invention, in addition to those not specifically recited, may be varied or otherwise particularly adapted to specific environments, manufacturing specifications, design parameters or other operating requirements without departing from the general principles of the same.

We claim:

1. A power distribution unit, comprising:
    a power distribution unit frame, wherein the power distribution unit frame has a 2U form factor, and wherein the power distribution unit frame is coupled to mount in an embedded computer frame;
    a circuit breaker connection site;
    a circuit breaker disposed to be coupled to the circuit breaker connection site, wherein the circuit breaker includes a set of auxiliary contacts; and
    an alarm module, wherein the alarm module is coupled to detect the circuit breaker when the circuit breaker is coupled to the circuit breaker connection site via the set of auxiliary contacts, wherein if the alarm module detects the circuit breaker, the alarm module monitors a set of shelf conditions.

2. The power distribution unit of claim 1, wherein if the alarm module fails to detect the circuit breaker coupled to the circuit breaker connection site, the alarm module not monitoring the set of shelf conditions.

3. The power distribution unit of claim 1, wherein the set of shelf conditions includes at least one of a computing blade condition and a power feed condition.

4. The power distribution unit of claim 1, wherein if the alarm module detects an alarm condition from the set of shelf conditions, the alarm module generates an alarm notice.

5. The power distribution unit of claim 1, the circuit breaker is hot-swappable.

6. A method of monitoring a power distribution unit, comprising:
    providing a power distribution unit frame, wherein the power distribution unit frame has a 2U form factor, and wherein the power distribution unit frame is coupled to mount in an embedded computer frame;
    coupling an alarm module to a circuit breaker connection site in the power distribution unit frame;
    the alarm module detecting whether a circuit breaker is coupled to the circuit breaker connection site via a set of auxiliary contacts;
    if the alarm module detects the circuit breaker, the alarm module monitoring a set of shelf conditions; and
    if the alarm module fails to detect the circuit breaker, the alarm module not monitoring the set of shelf conditions.

7. The method of claim 6, wherein if the alarm module detects the circuit breaker, the alarm module monitoring at least one of a computing blade condition and a power feed condition.

8. The method of claim 6, wherein if the alarm module detects an alarm condition from the set of shelf conditions, generating an alarm notice.

9. The method of claim 6, wherein monitoring the set of shelf conditions comprises monitoring the circuit breaker for a power feed fault condition, wherein if the power feed fault condition is detected, generating an alarm notice.

10. The method of claim 9, further comprising the power distribution unit comprising a plurality of circuit breakers and delineating which of the plurality of circuit breakers generated the power feed fault condition.

11. The method of claim 6, wherein monitoring the set of shelf conditions comprises monitoring a computing blade that is supplied power through the circuit breaker for a computing blade fault condition, wherein if the computing blade fault condition is detected, generating an alarm notice.

12. The method of claim 11, wherein the computing blade is an AdvancedTCA computing blade.

13. The method of claim 6, wherein the circuit breaker is hot-swappable.

14. A method of monitoring a power distribution unit, comprising:
    providing a power distribution unit frame, wherein the power distribution unit frame has a 2U form factor, and wherein the power distribution unit frame is coupled to mount in an embedded computer frame;
    coupling an alarm module to a circuit breaker connection site in the power distribution unit frame;
    the alarm module detecting whether a circuit breaker is coupled to the circuit breaker connection site via a set of auxiliary contacts;
    if the alarm module detects the circuit breaker, enabling monitoring a set of shelf conditions; and
    if the alarm module fails to detect the circuit breaker, disabling monitoring the set of shelf conditions.

15. The method of claim 14, further comprising without interrupting power to the power distribution unit:
    removing the circuit breaker from the circuit breaker connection site;
    the alarm module automatically disabling monitoring the plurality of shelf conditions;
    coupling the circuit breaker to the circuit breaker connection site; and
    the alarm module automatically enabling monitoring the plurality of shelf conditions.

16. The method of claim 14, wherein if the alarm module detects the circuit breaker, the alarm module monitoring at least one of a computing blade condition and a power feed condition.

17. The method of claim 14, wherein if the alarm module detects an alarm condition from the set of shelf conditions, generating an alarm notice.

18. The method of claim 14, wherein monitoring the set of shelf conditions comprises monitoring the circuit breaker for a power feed fault condition, wherein if the power feed fault condition is detected, generating an alarm notice.

19. The method of claim 18, further comprising the power distribution unit comprising a plurality of circuit breakers and delineating which of the plurality of circuit breakers generated the alarm notice.

20. The method of claim 14, wherein monitoring the set of shelf conditions comprises monitoring a computing blade that is supplied power through the circuit breaker for a computing blade fault condition, wherein if the computing blade fault condition is detected, generating an alarm notice.

* * * * *